(12) United States Patent
Jeong

(10) Patent No.: US 6,465,351 B1
(45) Date of Patent: Oct. 15, 2002

(54) METHOD OF FORMING A CAPACITOR LOWER ELECTRODE USING A CMP STOPPING LAYER

(75) Inventor: In-Kwon Jeong, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/563,716

(22) Filed: May 2, 2000

(30) Foreign Application Priority Data

May 3, 1999 (KR) .......................................... 99-15923

(51) Int. Cl.[7] .......................................... H01L 21/302
(52) U.S. Cl. ...................... 438/689; 438/690; 438/697; 438/700; 438/706; 438/745
(58) Field of Search ................................. 438/689, 690, 438/697, 700, 706, 745

(56) References Cited

U.S. PATENT DOCUMENTS

| | | |
|---|---|---|
| 5,021,357 A | 6/1991 | Taguchi et al. |
| 5,286,344 A * | 2/1994 | Blalock et al. ............. 156/657 |
| 5,374,580 A | 12/1994 | Baglee et al. |
| 5,643,819 A * | 7/1997 | Tseng ........................... 437/60 |
| 5,668,036 A | 9/1997 | Sune |
| 5,717,236 A | 2/1998 | Shinkawata |
| 5,763,304 A | 6/1998 | Tseng |
| 5,895,239 A * | 4/1999 | Jeng et al. ................... 438/239 |
| 6,165,840 A * | 12/2000 | Choi et al. ................... 438/253 |
| 6,198,122 B1 * | 3/2001 | Habu et al. .................. 257/296 |
| 6,258,691 B1 * | 7/2001 | Kim ............................ 438/398 |
| 6,268,244 B1 * | 7/2001 | Park ............................ 438/253 |

* cited by examiner

Primary Examiner—Benjamin L. Utech
Assistant Examiner—Vaness Perez-Ramos
(74) Attorney, Agent, or Firm—Volentine Francos, PLLC

(57) ABSTRACT

A method for fabricating a capacitor is provided that can reduce the number of CMP processes. It avoids the use of a CMP process on an uneven interlayer insulating layer on which a storage node is to be formed, by employing a process of forming a sacrificial oxide layer on the uneven interlayer insulating layer, forming a CMP stopper layer, forming another oxide layer, etching the deposited layers until a top surface of uneven interlayer insulating layer is exposed to form a trench therein for a storage node, depositing a conductive material in the trench and on the another oxide, and performing a CMP process until a top surface of the CMP stopper layer is exposed to electrically separate each storage node from another. The remainder of the oxide layer on the CMP stopper layer is then removed and then the CMP stopper layer is removed.

25 Claims, 7 Drawing Sheets

METHOD OF FORMING A CAPACITOR LOWER ELECTRODE USING A CMP STOPPING LAYER

This application relies for priority upon Korean Patent Application No. 99-15923, filed on May 3, 1999, the contents of which are herein incorporated by reference in their entirety.

BACKGROUND OF THE INVENTION

The present invention relates to a method for fabricating a semiconductor device, and more particularly to a method for fabricating a capacitor that can skip a CMP process with respect to an uneven interlayer insulating layer underlying a sacrificial oxide layer in which the capacitor is to be made.

An integrated circuit DRAM device typically includes many memory cells. In fact, a memory cell is provided for each bit stored by the DRAM device. Each individual memory cell typically consists of a storage capacitor and an access transistor. Either the source or the drain of the access transistor is connected to one terminal of the storage capacitor. The other side of the transistor's channel and the transistor gate electrode are connected to external connection lines called a bit line and a word line, respectively. The other terminal of the capacitor is connected to a reference voltage.

The formation of a DRAM memory cell includes the formation of a transistor, of a capacitor, and of contacts to external circuits. The capacitor types that have been typically used in DRAM memory cells are planar capacitors, because they are relatively simple to manufacture.

However, in order to fabricate high density DRAM devices, the memory cells must be scaled down in size to the sub-micrometer range. This causes a reduction in capacitor area, resulting in the reduction of the cell capacitance. In this case, because the area of the charge storage capacitor is also decreased, the capacitance of the planar capacitor becomes relatively small. This decreases in storage capacitor leads to lowered signal-to-noise ratios and increased errors due to alpha particle interference. Accordingly, for very small memory cells, planar capacitors become unreliable.

In addition, as the capacitance decreases, the charge held by the storage capacitor must be refreshed more often, further degrading performance. A simple planar capacitor generally cannot provide sufficient capacitance for good performance, even with high performance dielectrics, such as $Ta_2O_5$.

Prior approaches to overcoming these problems have resulted in the development of the trench capacitor (see for example, U.S. Pat. No. 5,374,580) and the stacked capacitor (see for example, U.S. Pat. No. 5,021,357). Trench capacitors experience the well-known problem of "gate diode leakage." Accordingly, stacked capacitors have been more widely fabricated recently.

For example, U.S. Pat. Nos. 5,763,304, 5,668,036, and 5,717,236, the disclosures of which are incorporated herein by reference, disclose a stacked capacitor that uses a chemical mechanical polishing (CMP) step with respect to an interlayer insulating layer on which the stacked capacitor is formed. In the conventional methods, a CMP process is carried out on the interlayer insulating layer because of its uneven surface topography. In a subsequent process, the CMP process is also carried out to electrically separate each storage node from one another.

As is well known, the CMP process suffers from the disadvantages of high expense, low throughput, process complexity, and high defect density. Accordingly, it would be very desirable to provide a method for fabricating a capacitor that can minimize the number of CMP processes required.

SUMMARY OF THE INVENTION

The present invention was made in view of the above problems, and is directed toward providing a method for fabricating a stacked capacitor that can minimize the use of CMP processes. In particular, the present invention omits a CMP process with respect to an interlayer insulating layer, but avoids causing problems mentioned above.

One of the features of the present invention is the formation of a CMP stopping layer on a sacrificial oxide layer to serve for CMP end point detection. Such a CMP stopping layer can make it possible to omit a CMP process with respect to the interlayer insulating layer.

Briefly, an interlayer insulating layer is formed over an integrated circuit substrate having undergone certain process steps, such as defining active and inactive regions, formation of transistors and formation of bit lines. Since transistors and bit lines are formed densely in the cell array region, and are formed sparsely in the peripheral region, there can arise a height difference (i.e., causing a step portion) in the surface of the interlayer insulating layer at the peripheral region. The interlayer insulating layer is preferably made of an oxide material selected from the group consisting of borophosphosilicate glass (BPSG) and undoped silicate glass (USG). More particularly, if a BPSG layer is formed, it is done so by the process of first depositing the BPSG, and then reflowing it at a predetermined temperature to provide a good surface topology.

Since conductive patterns are formed densely on the cell array region, the interlayer insulating layer has a substantially even surface over the cell array region. On the other hand, since conductive patterns are formed sparsely in the peripheral region, the interlayer insulating layer has an uneven surface topology over the peripheral region, i.e., it contains a step.

Contact plugs are then formed in the interlayer insulating layer. The contact plugs are electrically connected to the integrated circuit substrate. Unlike in the conventional method, a CMP process is not carried out on the interlayer insulating layer.

A sacrificial oxide layer is then deposited over the interlayer insulating layer, following the topography of the interlayer insulating layer. The sacrificial oxide layer is formed to a thickness at least the desired height of the storage node. This sacrificial oxide layer comprises an oxide material selected from the group consisting of BPSG, USG, phosphosilicate glass (PSG), spin on glass (SOG), hydrogen silsesquioxane (HSQ), and plasma enhanced tetraethylorthosilicate (PE-TEOS).

A CMP stopper layer is then formed over the sacrificial oxide layer, following the topography of the sacrificial oxide layer. The CMP stopper layer preferably comprises a material selected from the group consisting of silicon nitride, an alumina, a diamond-like carbon, aluminum nitride, and boron nitride. A second oxide layer may also be formed over the CMP stopping layer to provide a wide process margin for subsequent CMP processes.

Through photolithographic process, the second oxide layer, the CMP stopping layer, and the sacrificial oxide layer are etched to form trenches that expose the contact plugs. A conductive material, for the formation of the storage nodes, is then deposited in the trenches and over the second oxide layer. A CMP process is then carried out using the CMP stopping layer as an end point, to thereby form a storage node in the trench. The CMP stopping layer and any portions of the second oxide layer remaining over the CMP stopping layer at the lower portion of the step are then removed.

In method mentioned above, an etching stopper layer can also be formed prior to the formation of the sacrificial oxide layer. More specifically, after the formation of the contact plugs, an etching stopper layer, comprised of a nitride, may be deposited on interlayer insulating layer and the contact plugs. Alternately, the etching stopper layer can be formed formed on the interlayer insulating layer prior to the formation of the contact plugs. This etching stopper can allow a wide process margin during the formation of the trenches in the sacrificial oxide layer. Also, this etching stopper layer serves to increase capacitor area.

After removing the CMP stopping layer and any remaining second oxide layer, the sacrificial oxide layer outside the storage nodes is removed. In case that the etching stopper is formed on the interlayer insulating layer, it can be removed subsequent to the removal of the sacrificial oxide layer.

The method may also comprise forming a hemispherical grain (HSG) silicon layer on exposed portions of the conductive material, i.e., the storage nodes. This acts to increase the capacitance of a resulting capacitor.

In the alternative, a cylindrical stacked capacitor may be fabricated. In particular, after forming trenches for storage nodes in a frame insulating layer of a sacrificial oxide layer, a CMP stopping layer, and a second oxide layer, a conductive material is deposited in the trenches to only partially fill the trenches. Then a planarization insulating layer is deposited over the conductive material layer to completely fill the trenches. This planarization insulating layer in the trenches serves to protect the contamination of the interior trenches during subsequent CMP process. A CMP process is then carried out on the planarization insulating layer, the conductive material layer, and the second oxide layer, and stops at a top surface of the CMP stopping layer. Thus, a cylindrical storage nodes are formed in the trenches. The CMP stopping layer and any remaining second oxide layer are removed, and then the remaining planarization insulating layer in the interior trenches is removed to expose inner surfaces of the cylindrical capacitor storage nodes.

The method may also comprise forming a hemispherical grain (HSG) silicon layer on exposed portions of the conductive material, i.e., the cylindrical storage nodes. This acts to increase the capacitance of a resulting capacitor. The forming of a hemispherical grain (HSG) silicon layer may be performed before planarizing portions of the conductive material and the upper insulating layer, or it may be performed after planarizing portions of the conductive material and the upper insulating layer.

In accordance with one aspect of the invention, a method is provided for fabricating a capacitor in an integrated circuit device. This method comprises forming a lower insulating layer having an uneven surface topology over an integrated circuit substrate, forming a contact plug electrically connected to the integrated circuit substrate in the lower insulating layer, forming an upper insulating layer over the lower insulating layer and the contact plug, the upper insulating layer including a planarization stopper, etching the upper insulating layer to form a trench that exposes the contact plug and the lower insulating layer around the contact plug, depositing a conductive material in the trench and over the upper insulating layer, planarizing portions of the conductive material and the upper insulating layer until a top surface of the planarization stopper is exposed to electrically isolate remaining conductive materials inside the trenches from another, and removing remainders of the upper insulating layer until the lower insulating layer is exposed.

The method may further comprise forming an etching stopper over the lower insulating layer, prior to forming the upper insulating layer, and etching the etching stopper after removing the upper insulating layer.

The process of forming the upper insulating layer may itself further comprise forming a first oxide layer over the lower insulating layer, forming a planarization stopper layer over the first oxide layer, and forming a second oxide layer over the planarization stopper layer.

The planarizing of portions of the conductive material and the upper insulating layer preferably includes planarizing the conductive material and portions of the second oxide layer until the top surface of the planarization stopper layer is exposed.

The removing of remainders of the upper insulating layer until a top surface of the lower insulating layer is exposed, may itself comprise removing a remainder of the second oxide layer on the planarization stopper layer, removing the planarization stopper layer, and removing the first oxide layer.

The depositing of the conductive material may further comprise partially filling the trench with the conductive material and completely filling the remainder of the trench with an insulating material. The insulating material is preferably removed from the trench after the removing of remainders of the upper insulating layer.

In accordance with an alternative aspect of the invention, a method is provided for fabricating a capacitor in an integrated circuit device. This method comprises forming a first insulating layer over an integrated circuit substrate, the integrated circuit substrate having a step portion, etching the first insulating layer to form a contact opening to expose the integrated circuit substrate, filling the contact opening with a first conductive material to form a contact plug, forming a second insulating layer over the first insulating layer and the contact plug, forming a planarization stopper over the second insulating layer, forming a third insulating layer over the planarization stopper, etching the third insulating layer, the planarization stopper, and the second insulating layer to form a trench that exposes the contact plug, forming a conductive layer in the trench and over the third insulating layer, planarizing the conductive layer and the third insulating layer and stopping at a top surface of the planarization stopper to thereby form storage nodes inside the respective trenches, removing remainders of the third insulating layer on the planarization stopper at a lower part of the step portion, and removing the planarization stopper and the second insulating layer to expose an outer sidewall of the storage node of the capacitor.

The method may also comprise forming a hemispherical grain (HSG) silicon layer on the storage node.

The method may also comprise forming an etching stopper prior to forming the second insulating layer. This etching stopper is preferably made of a material having an etching selectivity with respect to the second insulating layer. In particular, the etching stopper preferably comprises a material selected from the group consisting of silicon nitride, alumina, diamond-like carbon, aluminum nitride and boron nitride.

The planarization stopper preferably comprises a material having an etching selectivity with respect to the second and third insulating layers. In particular, the planarization stopper preferably comprises a material selected from the group consisting of silicon nitride, alumina, diamond-like carbon, aluminum nitride and boron nitride.

The first insulating layer preferably comprises an oxide selected from the group consisting of borophosphosilicate glass (BPSG) and phosphosilicate glass (PSG). The second and third insulating layers are preferably made independently, and each preferably comprises a material selected from the group consisting of borophosphosilicate glass (BPSG), phosphosilicate glass (PSG), spin on glass (SOG), hydrogen silsesquioxane (HSQ), and plasma enhanced tetraethylorthosilicate (PE-TEOS).

In accordance with another aspect of the invention, a method for fabricating a capacitor in an integrated circuit device is provided that comprises providing an integrated circuit substrate having a cell region and peripheral region, forming a plurality of first transistors in the cell region, forming a plurality of second transistors in the peripheral region, forming a plurality of landing pads between the first transistors, forming a first insulating layer over the integrated circuit substrate to insulate the first and second transistors and the landing pads, densely forming a plurality of bit lines over the first insulating layer in the cell region, sparsely forming a plurality of local interconnections over the first insulating layer in the peripheral region, forming a second insulating layer over the first insulating layer, the plurality of bit lines and the plurality of local interconnections, the second insulating layer being conformal and following the contours of the underlying local interconnections and the first insulating layer, thereby causing a step portion to form in the peripheral region, etching the second insulating layer and the first insulating layer to form a plurality of contact openings exposing corresponding landing pads, filling the contact openings with a conductive material to form a plurality of contact plugs, forming an etching stopper over the second insulating layer and the contact plugs, forming a third insulating layer over the etching stopper, the third insulating layer defining a height of a storage node, forming a planarization stopper over the third insulating layer, forming a fourth insulating layer over the planarization stopper, etching the fourth insulating layer, the planarization stopper, the third insulating layer, and the etching stopper to form a plurality of trenches that expose the contact plugs, forming a conductive layer in the trenches and over the fourth insulating layer, planarizing the conductive layer and the fourth insulating layer and stopping at a top surface of the planarization stopper to thereby form storage nodes inside the respective trenches, removing remainders of the fourth insulating layer over the planarization stopper at a lower part of the step portion in the peripheral region, and removing the planarization stopper and the third insulating layer to expose outer sidewalls of the storage nodes.

The etching stopper and the planarization stopper are preferably made independently, and each preferably comprises a material selected from the group consisting of silicon nitride, an alumina, a diamond-like carbon, aluminum nitride and boron nitride. The third and fourth insulating layers are preferably made independently, and each preferably comprises a material selected from the group consisting of borophosphosilicate glass (BPSG), phosphosilicate glass (PSG), spin on glass (SOG), hydrogen silsesquioxane (HSQ), and plasma enhanced tetraethylorthosilicate (PE-TEOS).

In addition, the method may further comprise forming a hemispherical grain (HSG) silicon layer on the storage nodes.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Figure 1A:
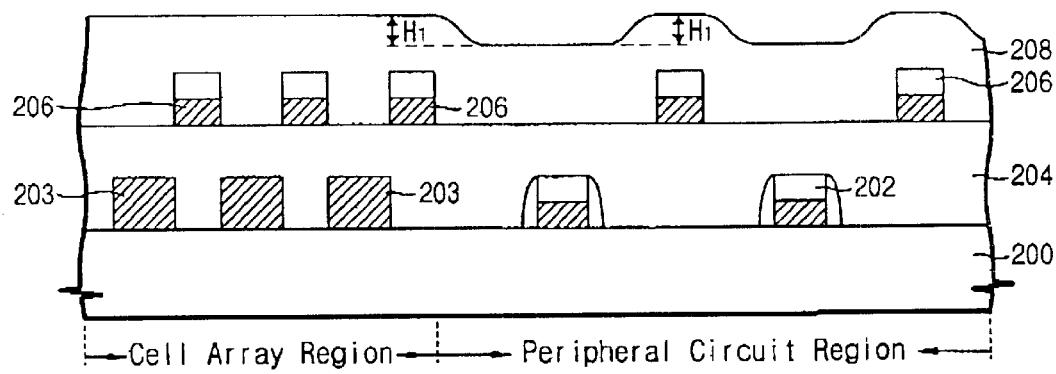
FIGS. 1A to 1H are cross-sectional views of an integrated circuit substrate, at selected process steps of fabricating a capacitor, according to a first preferred embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein includes its complementary conductivity type embodiment as well as the disclosed conductivity type embodiment..

The preferred embodiments of the present invention will now be described with reference to the accompanying drawings. The present invention relates to a method for fabricating a capacitor. The processes for forming the field oxide layer and the field effect transistor structure as presently practiced in manufacturing DRAM cells are only briefly described in order to better understand the current invention.

FIGS. 1A to 1G are cross-sectional views of an integrated circuit substrate, at selected process stages of a method for fabricating a simple stacked capacitor according to a first preferred embodiment of the present invention. Referring now to FIG. 1A, there is provided an integrated circuit substrate 200, preferably a silicon substrate. In the DRAM device, the semiconductor substrate includes a cell array that is used as a memory region for storing pieces of memory information, and a peripheral region that is necessary for external input/output. A device isolation process is carried out to define active regions surrounded by the field oxide. For example, a shallow trench isolation technique may be used, although other suitable techniques such as a local oxidation of silicon may be used instead. As used herein, active regions are portions of the substrate to which an electrical connection is to be made.

A plurality of transistors 202 are formed both on the cell array region and the peripheral region (although for clarity of disclosure, transistors 202 are only shown in the peripheral circuit region in FIGS. 1A to 1G). As is well known, transistors are formed densely in the cell array region and are formed sparsely in the peripheral region. It is required of a strict photolithography process in the formation of contact holes in the cell array region. Accordingly, cell pads 203 of a conductive material such as a polysilicon are formed in the cell array region. Since the formation of the transistors 202 and the cell pads 203 are widely known in the art, their explanation is omitted.

After the formation of the transistors 202 and the cell pads 203, a first interlayer insulating layer 204 is formed over the structure, to a thickness of about 7,000 Å to 9,000 Å by a conventional CVD (chemical vapor deposition) technique. The first interlayer insulating layer 204 is preferably made of a well-known oxide such as an undoped silicate glass (USG) or a borophosphosilicate glass (BPSG).

Next, bit line patterns 206 are formed conventionally on the first interlayer insulating layer 204 to be electrically connected to one of the source/drain region of the transistor through selected cell pads (not shown). As illustrated in the drawings, the bit line patterns 206 are also formed densely in the cell array region, but are formed sparsely in the peripheral region. Here, the bit line patterns 206 in the peripheral region serve as local interconnections.

A second interlayer insulating layer 208 is then formed on the first interlayer insulating layer 204 including the bit line patterns 206. The second interlayer insulating layer 208 has an uneven upper surface as deposited. In other words, because the second interlayer insulating layer 208 tends to be conformal, its upper surface follows the contours produced by the underlying structures (transistors and bit line patterns) formed on the integrated circuit substrate. Accordingly, a height difference (i.e., a step portion "$H_1$") is produced between the peripheral region and the cell array region, since the transistors and the bit line patterns are formed densely in the cell array region. The second interlayer insulating layer 208 is preferably made of a well-known oxide such as BPSG or USG. In this first embodiment, BPSG is deposited at a temperature of about 400° C. and is then reflowed at a temperature of about 800° C. to 850° C.

Unlike the conventional method, this embodiment of the present invention may omit the CMP process on the second insulating layer 208 because of the presence of a CMP stopper layer, as described later.

The next process sequence is the formation of a contact plug which contacts the active region (more particularly a predetermined source/drain region) to a later-formed capacitor lower electrode (storage node) through the cell pad. In advance, the second insulating layer 208 and first insulating layer 204 are selectively and anisotropically etched to form open contact holes that expose the cell pads 203. A conductive material such as polysilicon is then deposited on the second insulating layer 208 by a conventional CVD method to fill the contact holes and to thereby form contact plugs 212 that are electrically connected to the cell pads 203.

Figure 1B:
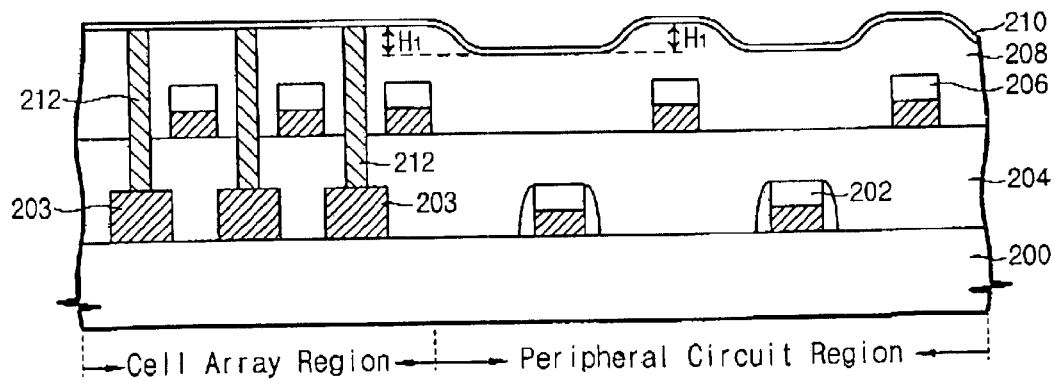

As shown in FIG. 1B, after the formation of the contact plugs 212, an optional it trench etching stopper 210 is deposited on the second insulating layer 208 including the contact plugs 212 to a thickness of about 10 Å to 2,000 Å. The trench etching stopper 210 is preferably made of a material that has an etching selectivity with respect to a later-formed sacrificial oxide layer, and is preferably made of a silicon nitride layer. This silicon nitride layer 210 serves as an etching stopper layer when the sacrificial oxide layers 214 and 218 are etched to form trenches. Other suitable materials can also be also used, however. For example, alumina ($Al_2O_3$), diamond-like carbon, aluminium nitride, boron nitride, or the like can be used instead of silicon nitride. This list of materials is not intended to be exhaustive but is rather intended to be exemplary. Depending upon the process conditions, the step of depositing the trench etching stopper layer can be skipped. In this case, the sacrificial oxide layer is time etched.

Alternatively, the etching stopper layer 210 can be deposited prior to the step of etching the second and first insulating layers 208 and 204. In other words, the etching stopper layer 210 is deposited on the second insulating layer 208. After that, the etching stopper layer 210 and second and first insulating layers 208 and 204 are etched to open the contact holes. Then a conductive material is deposited in the contact holes to form the contact plugs 212.

Figure 1C:
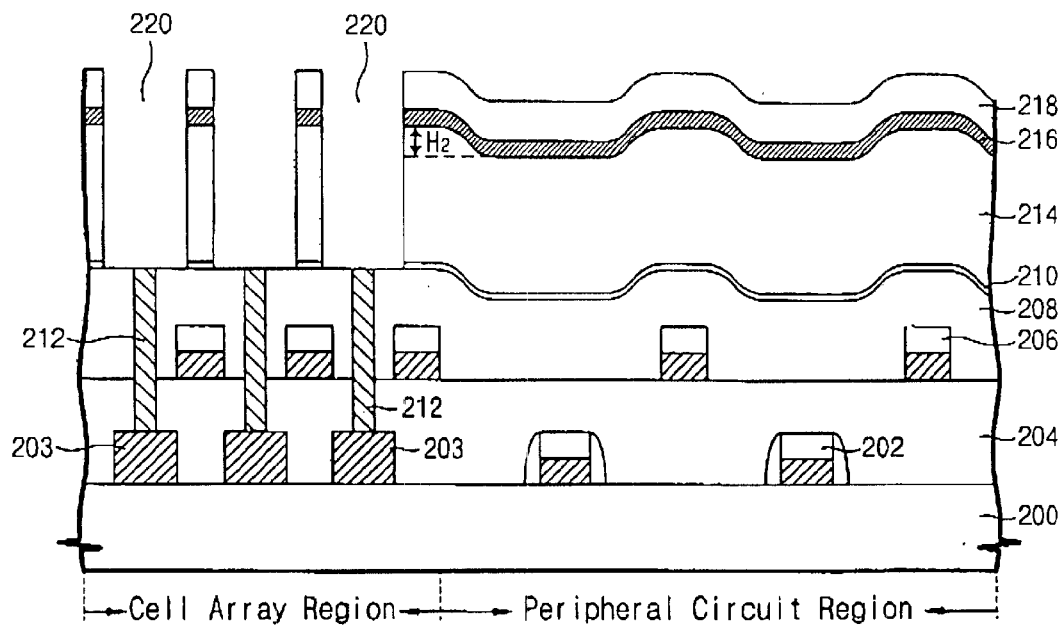

Next, frame insulating layers 214, 216, and 218 are sequentially deposited on the etching stopper 210. The frame insulating layers 214, 216, and 218, and the etching stopper 210 are then selectively etched to form trenches 220 in which a conductive material is deposited for the formation of a capacitor lower electrode, as shown in FIG. 1C.

More particularly, the frame insulating layers are preferably made of lower and upper oxide layers 214 and 218 with a CMP stopper 216 formed between them. The lower oxide layer 214 is called a sacrificial oxide layer and determines the height of the capacitor's lower electrode. In this embodiment, the sacrificial oxide layer 214 is preferably formed to a thickness of about 5,000 Å to 20,000 Å. Preferably, the sacrificial oxide layer 214 comprises BPSG, USG, PSG, SOG, HSQ, or PE-TEOS. This list of materials is not intended to be exhaustive, however, but is intended to be exemplary. Also, the surface of the sacrificial oxide layer 214 shows a second height difference "$H_2$".

The CMP stopper 216 is preferably made of a material that has an etching selectivity with respect to an oxide. Most preferably the CMP stopper 216 is a silicon nitride layer. However, other suitable material such as alumina ($Al_2O_3$), diamond-like carbon, aluminium nitride, boron nitride layer, or the like can be used instead of silicon nitride.

The CMP stopper 216 is preferably formed on the sacrificial oxide layer 214 to a thickness of about 10 Å to 2,000 Å. The CMP stopper 216 serves as an etching stopper when a CMP process is carried out for electrical separation between adjacent capacitor lower electrodes, thereby allowing for a uniform height of the capacitor lower electrodes.

Next, the upper oxide layer 218 is then deposited on the CMP stopper 216. The upper oxide layer is preferably made of a material selected from the group consisting of BPSG, PSG, SOG, HSQ, and PE-TEOS. This list of materials is not intended to be exhaustive but is rather intended to be exemplary.

Next, a photoresist layer (not shown) is spin coated onto the upper oxide layer 218 and is patterned into a predetermined configuration (i.e., photoresist pattern) that defines capacitor lower electrode regions. Using the patterned photoresist layer, the frame insulating layers and the trench etching stopper layer 210 are then etched to form trenches 220.

Figure 1D:
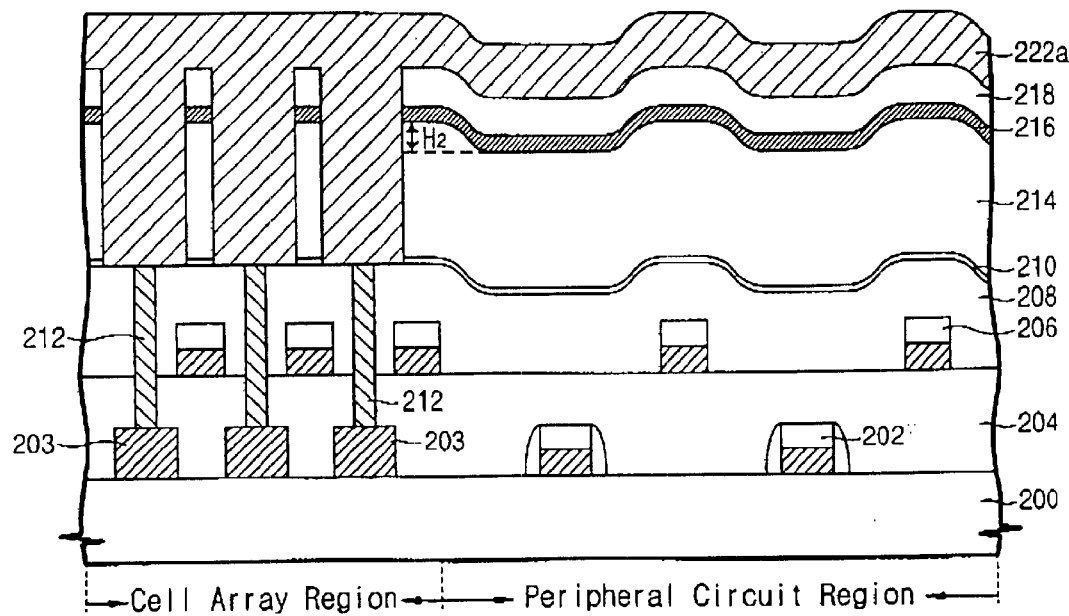

Referring now to FIG. 1D, a conductive layer 222a such as a polysilicon layer is then deposited on the upper oxide layer 218 to fill the trenches 220, preferably by a CVD technique. The polysilicon is preferably formed to a thickness of about 2,000 Å to 10,000 Å.

Figure 1E:
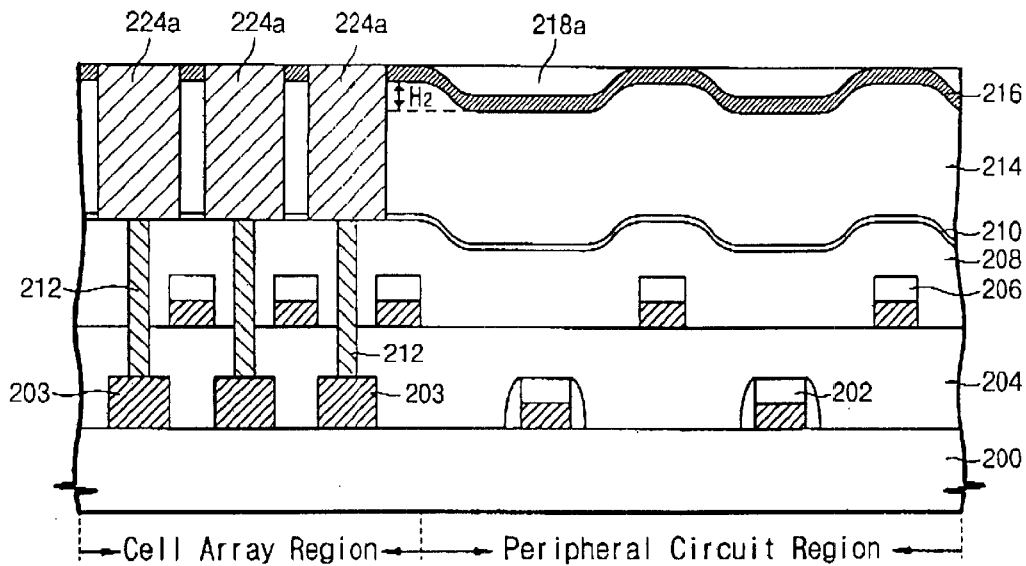
Figure 1F:
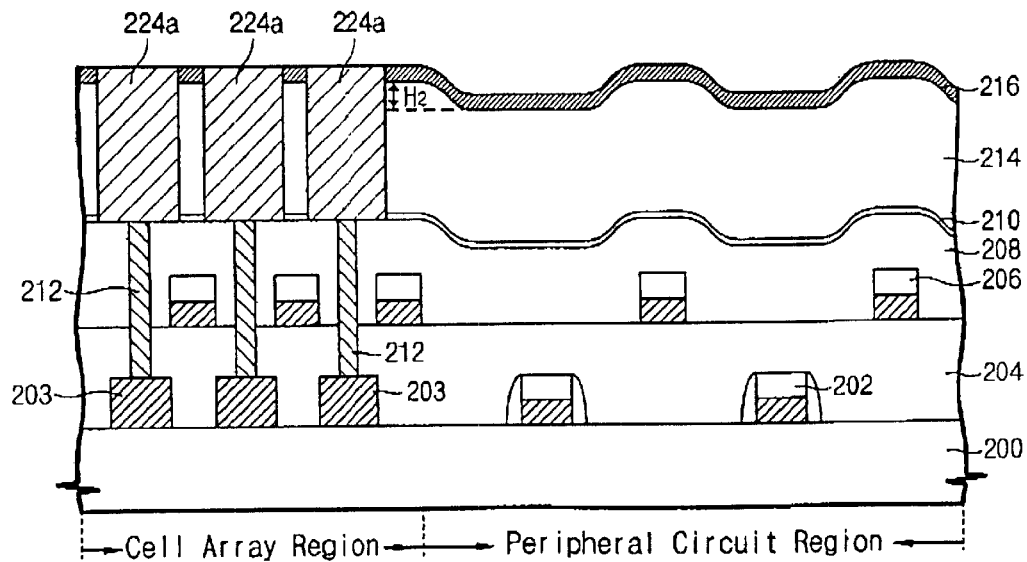

Next, as shown in FIG. 1E, electrical separation between adjacent capacitor lower electrodes is achieved through the use of a CMP process that is carried out using the CMP stopper layer 216 as an end point. During this process, portions of the upper oxide layer 218 and the conductive layer 222a are removed, leaving only upper oxide layer remaining portions 218a and conductive layer remaining portions 224a. The upper oxide layer remaining portions 218a on the lower portion of the step "$H_2$" in the peripheral region are then removed, preferably by a conventional oxide etching process, as shown in FIG. 2F. The CMP stopper 216 is then removed.

Figure 1G:
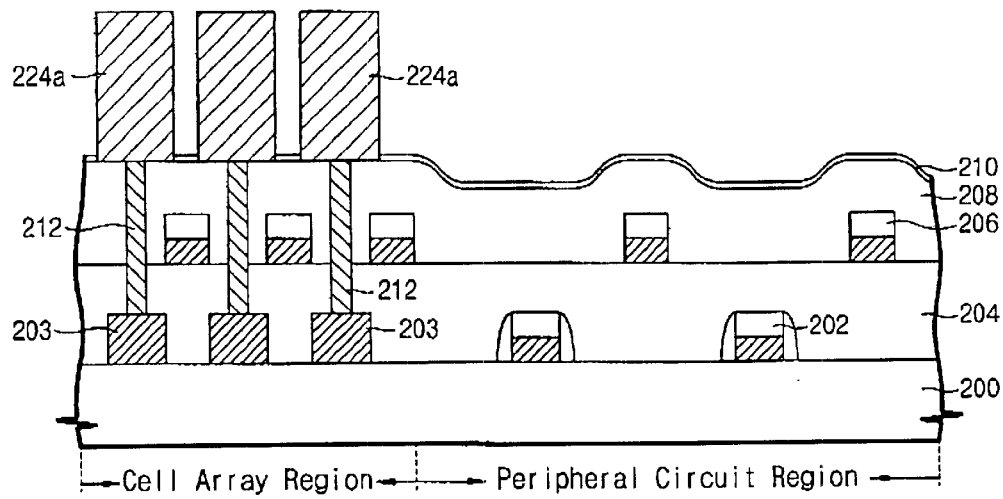

As shown in FIG. 1G, after removing the CMP stopper layer 216, the sacrificial oxide layer 214 is selectively etched with respect to the polysilicon until a top surface of the etching stopper 210 outside of the trenches is exposed. As a result of this process, capacitor lower electrodes 224a (i.e., the conductive layer remaining portions) having substantially the same height are formed, as shown in FIG. 1G.

However, if the CMP stopper 216 were not formed, as in the conventional method, two CMP processes would be required. In other words, a first CMP process should be performed until the top surface of the upper oxide layer 218 is exposed, and a second CMP process should be performed until the remainder of the polysilicon on the lower portion of the step "$H_2$" in the peripheral region is completely removed. The second CMP process could result in additional cost and process complexity.

Figure 1H:
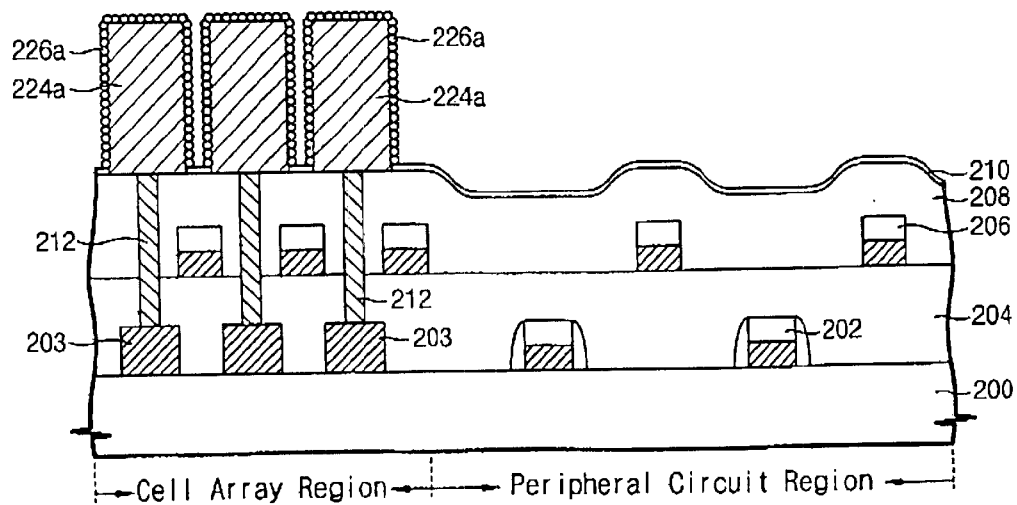

Next, in order to increase the surface areas of the capacitor lower electrodes 224a, a hemispherical grain (HSG) silicon layer 226a is formed by a conventional means on the outer surface of the capacitor lower electrodes as shown in FIG. 1H. Subsequently, a capacitor dielectric film (not shown) is conformally deposited on the lower electrode. This dielectric film can be formed of a nitride/oxide double film, an oxide/nitride/oxide triple film, or any other high dielectric film such as tantalum oxide. Afterwards, a capacitor upper electrode layer (not shown) is deposited on the dielectric film, preferably using a conventional CVD process. The capacitor upper electrode layer is then patterned and etched to form an upper electrode for the capacitor. Subsequently, interconnection and passivation processes are conventionally performed.

According to the above-mentioned method, the present invention provides capacitors without requiring a CMP process for the second insulating layer by forming a CMP stopper on the sacrificial oxide layer. As a result, the process cost can be lowered and process can be simplified.

A second preferred embodiment of the present invention will now be described below, with reference to FIGS. 2A to 2D. The second embodiment is related to a cylindrical capacitor unlike the simple stacked capacitor of the first embodiment. In FIGS. 2A to 2D, the same parts functioning as shown in FIGS. 1A to 1H are identified with the same reference numbers and their explanation is omitted. The process steps up to the formation of the trenches as shown in FIGS. 1A to 1C are identical to the second embodiment as in the first embodiment, and so their explanation is omitted.

Figure 2A:
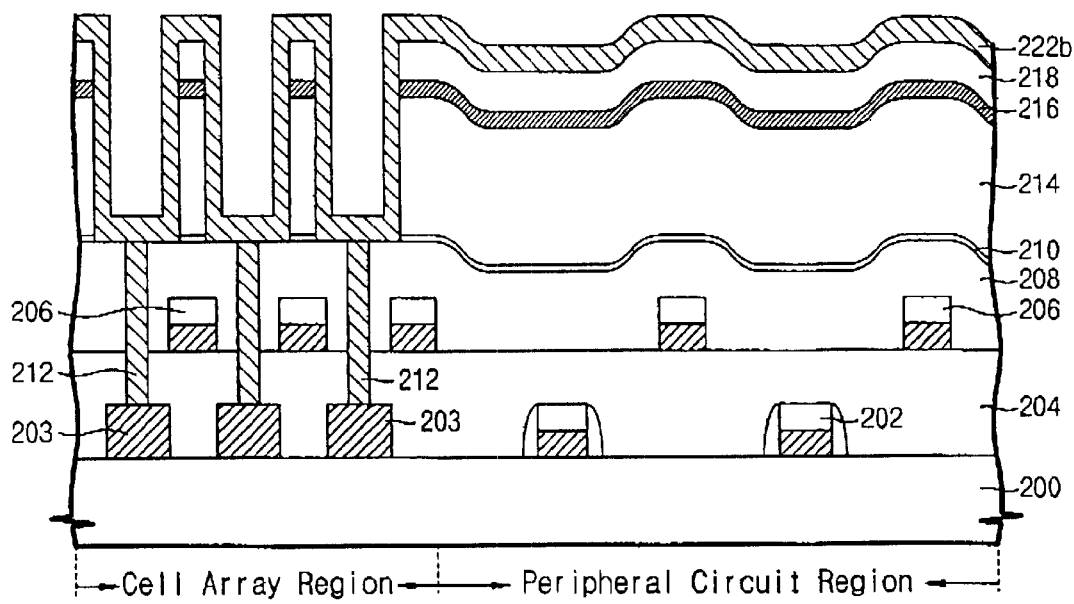
FIGS. 2A to 2D are cross-sectional views of an integrated circuit substrate, at selected process steps of fabricating a capacitor, according to a second preferred embodiment of the present invention.
Figure 2B:
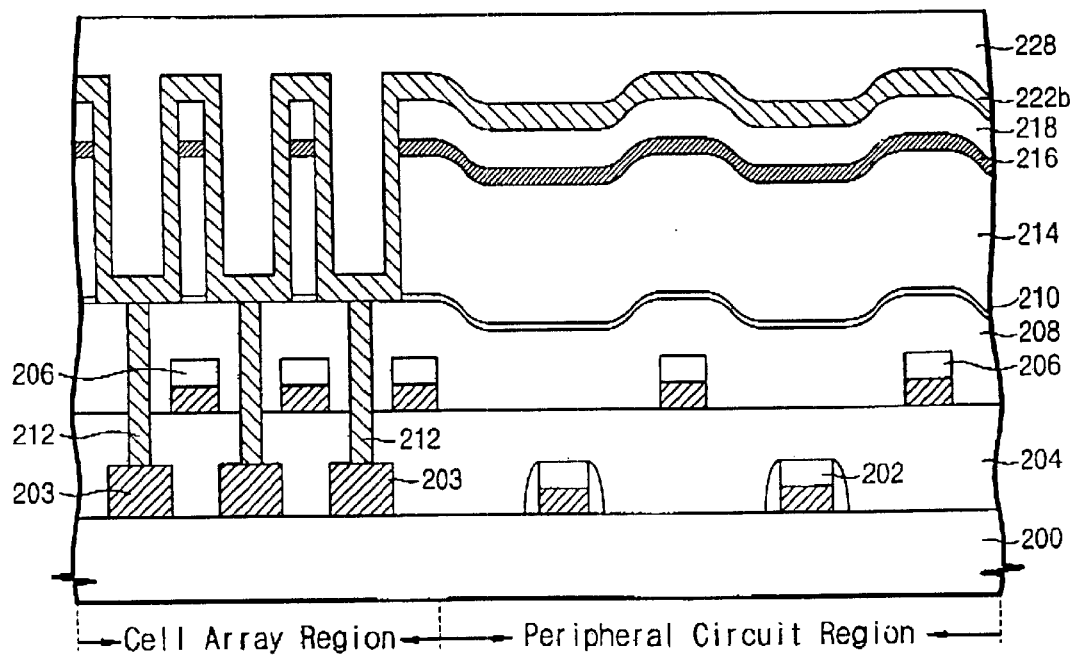

Referring now to FIG. 2A, after the formation of the trenches as in the first embodiment shown in FIG. 1C, a conductive layer 222b for use as a capacitor lower electrode is deposited in the trenches and on the upper oxide layer 218. The conductive layer 222b is preferably polysilicon at a thickness of about 100 Å to 1,000 Å, partially filling the trenches. However, this thickness can be varied depending on the processing conditions. Referring to FIG. 2B, a planarization insulating layer 228 is then deposited on the conductive layer 222b to completely fill the trenches and has a thickness of about 100 Å to 5,000 Å. This planarization insulating layer 228 serves to protect interior trenches and prevent the contamination of the conductive layer 222b inside the trenches during a subsequent planarization process. The planarization insulating layer 228 is preferably formed of an oxide layer selected from BPSG, USG, PSG, SOG, HSQ, and PE-TEOS.

A CMP process is carried out for electrical separation between adjacent capacitor lower electrodes and stops at a top surface of the CMP stopper 216, thereby forming capacitor lower electrodes 224b. Upper oxide layer remaining portions 218a on the lower portion of the step in the peripheral region are then removed by conventional oxide etching process and then the CMP stopper layer 216 is selectively removed. These steps are performed in a manner similar to that in the first preferred embodiment.

Figure 2C:
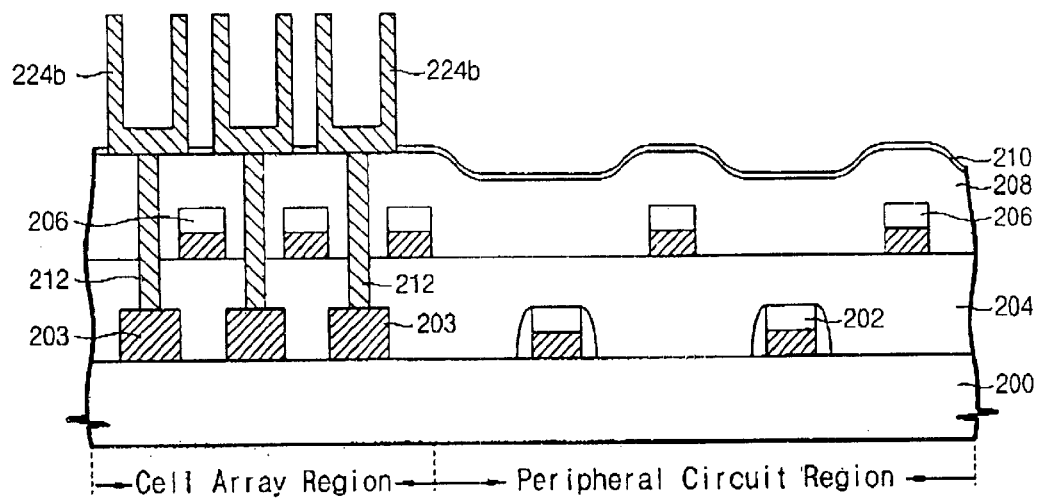
Figure 2D:
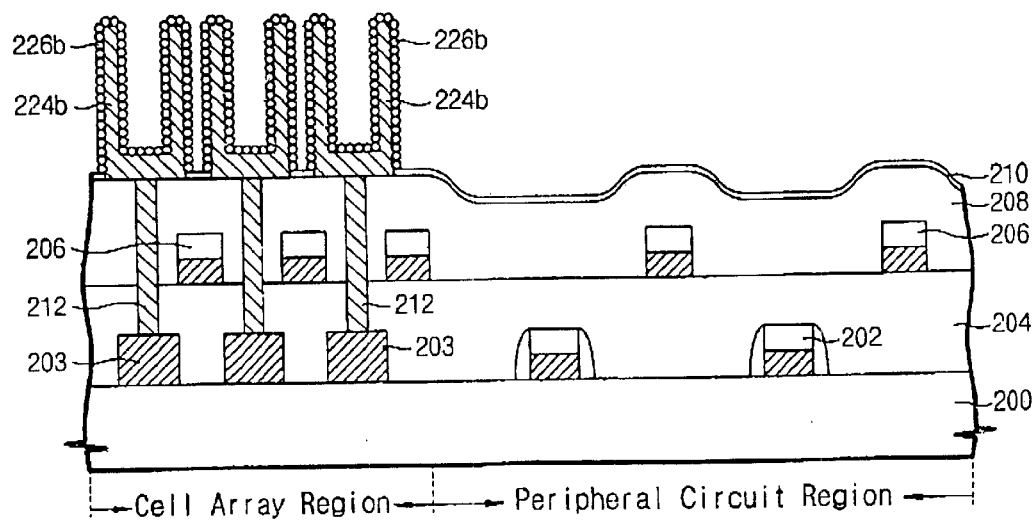

After removing the CMP stopper 216, the planarization oxide layer 228 remaining in the trench interiors and the sacrificial oxide layer 214 surrounding the trenches are removed to expose the inner surfaces and outer sidewalls of the capacitor lower electrodes 224b of cylindrical configuration as shown in FIG. 2C. In order to increase the surface areas of the capacitor lower electrodes, an HSG silicon layer 226b is then formed on exposed surfaces of the capacitor lower electrodes 224b as shown in FIG. 2D.

Subsequently, a capacitor dielectric film (not shown) is conformally deposited on the lower electrodes 224b. The dielectric film can be formed of a nitride/oxide double film, an oxide/nitride/oxide triple film, or any other high dielectric film such as tantalum oxide. Afterwards, a capacitor upper electrode layer (not shown) is deposited on the dielectric film using a conventional CVD process. The capacitor upper electrode layer is then patterned and etched to form an upper electrode for the capacitor.

Figure 3A:
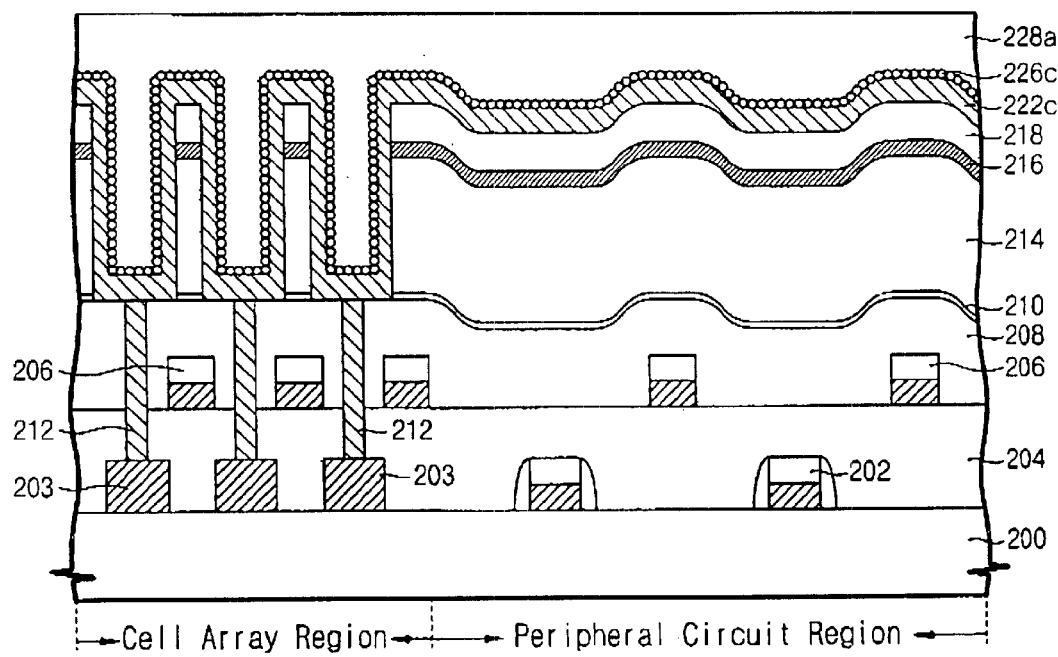
FIGS. 3A and 3B are cross-sectional views of an integrated circuit substrate, at selected process steps of fabricating a capacitor, according to a third preferred embodiment of the present invention.
Figure 3B:
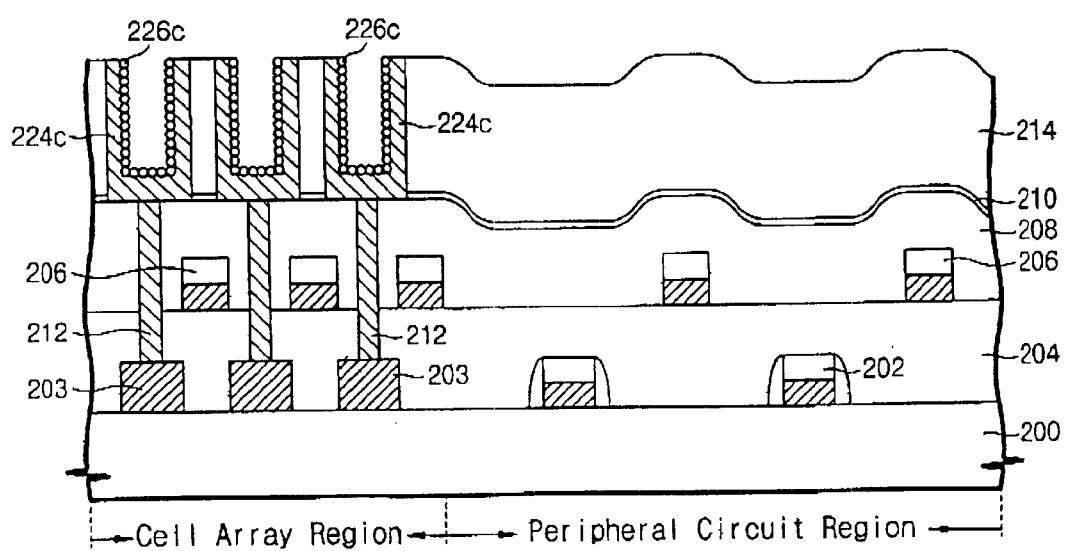

FIGS. 3A and 3B are cross-sectional views of selected stages of a method for fabricating a capacitor in accordance with a third preferred embodiment of the present invention. As in the second preferred embodiment, the third preferred embodiment provides a cylindrical capacitor. However, the third preferred embodiment is different from the second preferred embodiment in that an HSG silicon layer is formed at a process step different from that of the second preferred embodiment. In FIGS. 3A and 3B, the parts that function as shown in FIGS. 2A to 2C are identified with the same reference numbers and so their explanation is omitted.

Referring now to FIG. 3A, after depositing a conductive layer 222c as in the second preferred embodiment of FIG. 2A, HSG silicon layer 226c is formed on the conductive layer 222c. A planarization protection layer 228a is then deposited on the as silicon layer 226c, and then a planarization process such as a CMP process is carried out on the planarization protection layer 228a and the conductive layer 222c, which stops at a top surface of the CMP stopper 216. Thus, cylindrical lower electrodes 224c are formed in the trenches. Then, the remainder of the upper oxide layer 218 and the CMP stopper 216 are etched. The remainder of the planarization oxide layer 228a in the trench is then removed to expose an inner surface of the cylindrical capacitor lower electrodes 224c, as shown in FIG. 3B.

In this embodiment, the HSG silicon layer 226c is formed only on the inner surface of the cylindrical lower electrode 224c. The sacrificial oxide layer 214 surrounding the capacitor lower electrode 224c can be removed simultaneously when the remainder of the planarization oxide layer is removed from the trench.

The present invention provides a low cost and a simple process for a capacitor fabrication by skipping CMP process on the insulating layer on which a capacitor is formed.

It will be recognized by those skilled in the art that the innovative concepts disclosed in the present application can be applied in a wide variety of contexts. Moreover, the preferred implementation can be modified in a tremendous variety of ways. Accordingly, it should be understood that the modification and variations suggested below and above are merely illustrative. These examples may help to show some of the scope of the inventive concepts, but these examples do not nearly exhaust the full scope of variation in the disclosed novel concepts.

What is claimed is:

1. A method for fabricating a capacitor in an integrated circuit device, comprising:
    forming a lower insulating layer having an uneven surface topology over an integrated circuit substrate;
    forming a contact plug electrically connected to the integrated circuit substrate in the lower insulating layer;
    forming an upper insulating layer over the lower insulating layer and the contact plug, the upper insulating layer including a planarization stopper;
    etching the upper insulating layer to form a trench that exposes the contact plug and the lower insulating layer around the contact plug;
    depositing a conductive material in the trench and over the upper insulating layer;
    planarizing portions of the conductive material and the upper insulating layer until a top surface of the planarization stopper is exposed to electrically isolate remaining conductive materials inside the trenches from another; and
    removing remainders of the upper insulating layer until the lower insulating layer is exposed.

2. A method for fabricating a capacitor in an integrated circuit device, as recited in claim 1, further comprising:
    forming an etching stopper over the lower insulating layer, prior to forming the upper insulating layer; and
    etching the etching stopper after removing the upper insulating layer.

3. A method for fabricating a capacitor in an integrated circuit device, as recited in claim 2, wherein the lower insulating layer comprises an oxide selected from the group consisting of borophosphosilicate glass (BPSG) and undoped silicate glass (USG).

4. A method for fabricating a capacitor in an integrated circuit device, as recited in claim 2, wherein the etching stopper comprises a material selected from the group consisting of silicon nitride, alumina, diamond-like carbon, aluminum nitride, and boron nitride.

5. A method for fabricating a capacitor in an integrated circuit device, as recited in claim 1, wherein the planarization stopper comprises a material selected from the group consisting of silicon nitride, alumina, diamond-like carbon, aluminum nitride, and boron nitride.

6. A method for fabricating a capacitor in an integrated circuit device, as recited in claim 1, wherein the upper insulating layer further comprises:
    forming a first oxide layer over the lower insulating layer;
    forming a planarization stopper over the first oxide layer; and
    forming a second oxide layer formed over the planarization stopper.

7. A method for fabricating a capacitor in an integrated circuit device, as recited in claim 6, wherein the planarization stopper comprises a material selected from the group consisting of silicon nitride, alumina, diamond-like carbon, aluminum nitride, and boron nitride.

8. A method for fabricating a capacitor in an integrated circuit device, as recited in claim 6, wherein the first oxide layer comprises a material selected from the group consisting of borophosphosilicate glass (BPSG), phosphosilicate glass (PSG), spin on glass (SOG), hydrogen silsesquioxane (HSQ), and plasma enhanced tetraethylorthosilicate (PE-TEOS).

9. A method for fabricating a capacitor in an integrated circuit device, as recited in claim 6, wherein the planarizing of portions of the conductive material and the upper insulating layer comprises planarizing the conductive material and portions of the second oxide layer until the top surface of the planarization stopper is exposed.

10. A method for fabricating a capacitor in an integrated circuit device, as recited in claim 9, wherein removing remainders of the upper insulating layer until the lower insulating layer is exposed comprises:
    removing a remainder of the second oxide layer on the planarization stopper;
    removing the planarization stopper; and
    removing the first oxide layer.

11. A method for fabricating a capacitor in an integrated circuit device, as recited in claim 1,
    wherein depositing the conductive material further comprises:
        partially filling the trench with the conductive material; and
        completely filling the remainder of the trench with an insulating material, and
    wherein the insulating material is removed from the trench after the removing of remainders of the upper insulating layer.

12. A method for fabricating a capacitor in an integrated circuit device, as recited in claim 11, further comprising forming the hemispherical grain (HSG) silicon layer on a second surface of the conductive material after partially filling the trench with the conductive material.

13. A method for fabricating a capacitor in an integrated circuit device, as recited in claim 1, further comprising forming a hemispherical grain (HSG) silicon layer on a first surface of the remaining conductive materials after removing the remainders of the upper insulating layer.

14. A method for fabricating a capacitor in an integrated circuit device, comprising:
    forming a first insulating layer over an integrated circuit substrate, the integrated circuit substrate having a step portion;
    etching the first insulating layer to form a contact opening to expose the integrated circuit substrate;
    filling the contact opening with a first conductive material to form a contact plug;
    forming a second insulating layer over the first insulating layer and the contact plug;
    forming a planarization stopper over the second insulating layer;
    forming a third insulating layer over the planarization stopper;
    etching the third insulating layer, the planarization stopper, and the second insulating layer to form a trench that exposes the contact plug;
    forming a conductive layer in the trench and over the third insulating layer;
    planarizing the conductive layer and the third insulating layer and stopping at a top surface of the planarization stopper, to thereby form a storage node inside the trench;

removing remainders of the third insulating layer on the planarization stopper at a lower part of the step portion; and removing the planarization stopper and the second insulating layer to expose an outer sidewall of the storage node of the capacitor.

15. A method for fabricating a capacitor in an integrated circuit device, as recited in claim 14, further comprising forming an etching stopper prior to forming the second insulating layer, the etching stopper comprising a material having an etching selectivity with respect to the second insulating layer.

16. A method for fabricating a capacitor in an integrated circuit device, as recited in claim 15, wherein the second insulating layer comprises a material selected from the group consisting of borophosphosilicate glass (BPSG), phosphosilicate glass (PSG), spin on glass (SOG), hydrogen silsesquioxane (HSQ), and plasma enhanced tetraethylorthosilicate (PE-TEOS).

17. A method for fabricating a capacitor in an integrated circuit device, as recited in claim 15, wherein the etching stopper comprises a material selected from the group consisting of silicon nitride, alumina, diamond-like carbon, aluminum nitride, and boron nitride.

18. A method for fabricating a capacitor in an integrated circuit device, as recited in claim 14, wherein the planarization stopper comprises a material having an etching selectivity with respect to the second and third insulating layers.

19. A method for fabricating a capacitor in an integrated circuit device, as recited in claim 18, wherein the planarization stopper comprises a material selected from the group consisting of silicon nitride, alumina, diamond-like carbon, aluminum nitride, and boron nitride.

20. A method for fabricating a capacitor in an integrated circuit device, as recited in claim 18, wherein the second and third insulating layers are independently made, and each comprise a material selected from the group consisting of borophosphosilicate glass (BPSG), phosphosilicate glass (PSG), spin on glass (SOG), hydrogen silsesquioxane (HSQ), and plasma enhanced tetraethylorthosilicate (PE-TEOS).

21. A method for fabricating a capacitor in an integrated circuit device, as recited in claim 14, wherein the first insulating layer comprises an oxide selected from the group consisting of borophosphosilicate glass (BPSG) and phosphosilicate glass (PSG).

22. A method for fabricating a capacitor in an integrated circuit device, as recited in claim 14, further comprising forming a hemispherical grain (HSG) silicon layer on the storage node.

23. A method for fabricating a capacitor in an integrated circuit device, comprsing;

providing an integrated circuit substrate having a cell region and a peripheral region;

forming a plurality of first transistors in the cell region;

forming a plurality of second transistors in the peripheral region;

forming a plurality of landing pads between the first transistors;

forming a first insulating layer over the integrated circuit substrate to insulate the first and second transistors and the landing pads;

densely forming a plurality of bit lines over the first insulating layer in the cell region;

sparsely forming a plurality of local interconnections over the first insulating layer in the peripheral region;

forming a second insulating layer over the first insulating layer, the plurality of bit lines, and the plurality of local interconnections, the second insulating layer being conformal and following the contours of the underlying local interconnections and the first insulating layer, thereby causing a step portion to form in the peripheral region;

etching the second insulating layer and the first insulating layer to form a plurality of contact openings exposing corresponding landing pads;

filling the contact openings with a conductive material to form a plurality of contact plugs;

forming an etching stopper over the second insulating layer and the contact plugs;

forming a third insulating layer over the etching stopper, the third insulating layer defining a height of a storage node;

forming a planarization stopper over the third insulating layer;

forming a fourth insulating layer over the planarization stopper;

etching the fourth insulating layer, the planarization stopper, the third insulating layer, and the etching stopper to form a plurality of trenches that expose the contact plugs;

forming a conductive layer in the trenches and over the fourth insulating layer;

planarizing the conductive layer and the fourth insulating layer and stopping at a top surface of the planarization stopper to thereby form a storage node inside the trench;

removing remainders of the fourth insulating layer over the planarization stopper at a lower part of the step portion in the peripheral region; and removing the planarization stopper and the third insulating layer to expose outer sidewalls of the storage nodes.

24. A method for fabricating a capacitor in an integrated circuit device, as recited in claim 23, wherein the etching stopper and the planarization stopper are independently made, and each comprises a material selected from the group consisting of silicon nitride, an alumina, a diamond-like carbon, aluminum nitride and boron nitride, and wherein the third and fourth insulating layers are independently made, and each comprise a material selected from the group consisting of borophosphosilicate glass (BPSG), phosphosilicate glass (PSG), spin on glass (SOG), hydrogen silsesquioxane (HSQ), and plasma enhanced tetraethylorthosilicate (PE-TEOS).

25. A method for fabricating a capacitor in an integrated circuit device, as recited in claim 23, further comprising forming a hemispherical grain (HSG) silicon layer on the storage nodes.

* * * * *